(12) United States Patent
Krolak

(10) Patent No.: US 6,592,679 B2
(45) Date of Patent: Jul. 15, 2003

(54) CLEAN METHOD FOR VACUUM HOLDING OF SUBSTRATES

(75) Inventor: Michael Krolak, Los Gatos, CA (US)

(73) Assignee: Asyst Technologies, Inc., Fremont, CA (US)

( * ) Notice: Subject to any disclaimer, the term of this patent is extended or adjusted under 35 U.S.C. 154(b) by 0 days.

(21) Appl. No.: 09/905,490

(22) Filed: Jul. 13, 2001

(65) Prior Publication Data

US 2003/0010358 A1 Jan. 16, 2003

(51) Int. Cl.[7] .............................. B08B 5/00; B08B 5/02; B08B 5/04
(52) U.S. Cl. ................... 134/21; 134/25.4; 134/902; 118/715; 118/725; 118/728; 118/730
(58) Field of Search .................. 134/21, 25.4, 902; 118/715, 725, 728, 729, 730

(56) References Cited

U.S. PATENT DOCUMENTS

| | | | | |
|---|---|---|---|---|
| 5,643,366 A | * | 7/1997 | Somekh et al. | 118/729 |
| 6,090,220 A | * | 7/2000 | Kim et al. | 134/21 |
| 6,170,496 B1 | * | 1/2001 | Chen et al. | 134/102.1 |
| 6,206,970 B1 | * | 3/2001 | Atwell | 118/715 |
| 6,254,690 B1 | * | 7/2001 | Ueki | 134/6 |

* cited by examiner

Primary Examiner—Zeinab El-Arini
(74) Attorney, Agent, or Firm—O'Melveny & Myers LLP

(57) ABSTRACT

A system for preventing contaminants and particulates from coming into contact with a back side of a workpiece as the workpiece is vacuum held on a chuck or robotic end effector.

10 Claims, 5 Drawing Sheets

CLEAN METHOD FOR VACUUM HOLDING OF SUBSTRATES

BACKGROUND OF THE INVENTION

1. Field of the Invention

The present invention relates to the processing of workpieces such as semiconductor wafers, and in particular to a system for preventing contaminants and particulates from coming into contact with a back side of a workpiece as the workpiece is vacuum held on a chuck or robotic end effector.

2. Description of Related Art

During the fabrication of semiconductor wafers, workpieces such as wafers, reticles and flat panel displays are transported between various tools in the wafer fab. These tools include process tools for forming the integrated circuit patterns on the wafers, metrology tools for testing the wafers, sorters for sorting and rearranging the wafers within one or more SMIF pods, and stockers for large scale storage of the SMIF pods.

The processes carried out in each of the above tools must be carried out in a relatively contaminant- and particulate-free environment, such as cleanroom class 1 or better. In present day semiconductor fabrication, particles which range from below 0.02 microns ($\mu$m) to above 200 $\mu$m can be very damaging in semiconductor processing because of the small geometries employed in fabricating semiconductor devices. Typical advanced semiconductor processes today employ geometries which are one-half $\mu$m and under. Unwanted contamination particles which have geometries measuring greater than 0.1 $\mu$m substantially interfere with 1 $\mu$m geometry semiconductor devices. The trend, of course, is to have smaller and smaller semiconductor processing geometries which today in research and development labs approach 0.1 $\mu$m and below. In the future, geometries will become smaller and smaller and hence smaller and smaller contamination particles and molecular contaminants become of even greater interest.

Tools within a wafer fab typically include a front end interface which houses components that facilitate and monitor the transfer of wafers and other workpieces between workpiece-carrying pods and the tools. A conventional front end unit generally includes a workpiece handling robot 24 mounted within the housing and capable of r, θ, z motion to transfer workpieces between the workpiece carriers, tool and other front end components. The robot includes an end effector capable of holding and transferring workpieces. Such end effectors may include a vacuum gripping system wherein a sealed evacuation compartment beneath a workpiece on the end effector is evacuated, causing atmospheric pressure to press down on the substrate surface. Vacuum holding of workpieces on the end effector results in greatly increased frictional force between the end effector and workpiece.

In order to evacuate the evacuation compartment beneath the workpiece, a flexible hose is threaded through the various links of the robot having a proximal end connected to an electric valve adjacent to or remote from the base of the robot. The hose includes a distal end connected to the evacuation compartment. The valve is in turn connected to both a pump and a source of venting air so that, under the direction of a controller monitoring the transfer of workpieces by the robot, air may be evacuated from the evacuation compartment to hold the workpiece, and air may be vented, or backfilled, to the evacuation compartment to free the workpiece.

In addition to a robot, a tool front end unit generally includes one or more prealigners for performing the operation of wafer center identification, notch orientation, and indicial mark reading. A prealigner includes a rotating chuck for receiving a wafer. The robot deposits the wafer on the chuck, and the chuck then rotates the wafer so that, with the assistance of sensors and/or cameras positioned adjacent the workpiece, the indicial mark may be located and read. Tools, for carrying out workpiece processing, metrology and sorting, may similarly include workpiece holding chucks wherever it is desired to support a wafer or other workpiece in a fixed and repeatable position.

The prealigner and tool workpiece-support chucks may typically also include a vacuum holding system where a sealed area behind the workpiece is evacuated to improve the frictional force holding the workpiece on the chuck. As with a robotic end effector, a hose is connected to a central opening of a shaft supporting the chuck. The central opening is in turn in communication with an evacuation compartment beneath a workpiece seated on the chuck. An electric valve as described above is additionally provided for controlling evacuation and venting to the compartment beneath the workpiece.

For rotating chucks, a seal block 20 as shown in Prior Art FIG. 1 is provided to communicate the evacuation or venting from the valve to an evacuation compartment 22 in a chuck 24. Seal block 20 includes bearings 26 for rotationally supporting the chuck 24, and a bore hole 28 having a first end to which the hose 30 is connected. The bore hole includes a second end open to an annular cavity 32. The chuck-supporting shaft 34 in turn includes a second bore hole 36 which maintains a central opening 38 in the shaft in communication with the annular cavity 32 so that the vacuum/vent may be communicated to the compartment 22 as the chuck rotates. The seal block 20 includes a pair of O-rings 40 above and below the annular cavity 32 to prevent leakage into or out of the annular cavity 32 as shaft 34 rotates.

When a vacuum held workpiece is transferred from an end effector to a support surface, or from a chuck to a robot, it is important that the vacuum be fully vented before the transfer occurs. For example, in the case of the transfer of a vacuum held workpiece from an end effector, if the vacuum is not completely vented when the workpiece is lowered onto the support surface, excessive forces may be generated between the support surface, workpiece and end effector before the seal is broken. These excessive forces can cause the workpiece to bounce, and can scratch, damage or in a worst case, break the workpiece. Extraneous forces on the end effector may also have hysteresis and other adverse effects on the robot. In the same manner, excessive forces may be generated between the support surface, workpiece and end effector if the vacuum is not completely vented in the case of a transfer of a vacuum held workpiece from a chuck.

In order to ensure a vacuum is completely vented, it is therefore conventional practice for the electric valve to simply open the vent port so that air blasts back into the evacuated chamber at the time of workpiece transfer. There are however, several problems associated with this method of venting. First, the venting source of air brought in through the venting orifice is typically from the fab itself, and is significantly less clean than the cleanroom class 1 or better conditions in which workpieces such as wafers are typically handled. Second, the rapid blasting of air back into the evacuation chamber can dislodge particles from within the electric valve or within the hose. Additionally, in the case of a rotating chuck, where the stationary O-rings 40 (FIG. 1) lie in contact with the rotating shaft 34, particlulates from the O-rings may also be a source of contaminants that are dislodged upon venting.

While it would be possible to delay the workpiece transfer until the vacuum is completely vented, there are literally thousands of such transfers that occur every day in a semiconductor wafer fab, and the cumulative effect of such a delay would be significant.

The particles and contaminants that are brought in through the venting orifice and particles and contaminants that are dislodged upon the rapid venting are communicated up to the evacuation chamber and into contact with the back side of the wafer. When the wafer is subsequently loaded into a wafer-carrying pod, these contaminants can dislodge and fall onto the upper surface the wafer below. Moreover, it is currently common practice to polish the back side of wafers to provide a highly controlled thickness of a wafer and to provide a precisely defined reference surface. Having particulates contact the back side of wafers significantly undermines the advantages that back side polishing provides.

SUMMARY OF THE INVENTION

It is therefore an advantage of the present invention to prevent the introduction of particulates and contaminants onto the back side of workpieces including semiconductor wafers, reticles and flat panel displays.

It is a further advantage of the present invention to allow rapid venting of air to fully dissipate a vacuum prior to transfer of a workpiece.

It is another advantage of the present invention that it may be quickly and easily incorporated and maintained within a conventional end effector or workpiece chuck.

These and other advantages are provided by the present invention which in preferred embodiments relates to a system for preventing contaminants and particulates from coming into contact with a back side of a workpiece as the workpiece is vacuum held on a chuck or robotic end effector. The vacuum system according to the present invention comprises a filter provided along the vacuum path, and a novel configuration of an evacuation channel in the workpiece support surface for the vacuum holding of workpieces on the support surface.

The filter serves at least three functions. First, as vented air blasts into the vacuum path, the filter removes particles dislodges by the venting air so that only clean air or other vented gas comes into contact with the workpiece. Second, the filter impedes the flow of air to the back side of the wafer. Thus, particles in the area of the workpiece are not dislodged. Flow may be controlled by the filter by controlling the area of the filter and/or the type of filter. Moreover, by positioning the filters near to the distal end of the vacuum path, i.e., at or near the wafer holding area, the blasted vent air may travel rapidly over the majority of the vacuum path, and have only a minimal volume to backfill downstream of the filter. This minimal volume may be filled relatively quickly, even at the reduced flow rate, so that no delay occurs in venting the vacuum.

In a further aspect of the invention, the workpiece support surface on either the end effector or workpiece chuck includes an evacuation channel for communicating the lower pressure to the back side of the workpiece. By making the evacuation channel relatively shallow, this reduces the volume of air required to vent the evacuation channels. The evacuation channel is defined by a pair of walls which contact the back side of the workpiece. These walls preferably have a minimal width, thus reducing the likelihood of particulate generation as a result of contact between the workpiece and support surface.

BRIEF DESCRIPTION OF THE DRAWINGS

Embodiments of the present invention will now be described with reference to the drawings, in which.

DETAILED DESCRIPTION

The present invention will now be described with reference to FIGS. 2–7, which in preferred embodiments relates to a clean vacuum holding system for preventing contaminants and particulates from coming into contact with a back side of a workpiece as the workpiece is vacuum held on a workpiece chuck or robotic end effector. A preferred embodiment will be described hereinafter with respect to the holding and transfer of semiconductor wafers. However, it is understood that the present invention may be used to hold a variety of workpieces without exposure to contaminants, including reticles and flat panel displays.

Figure 1:
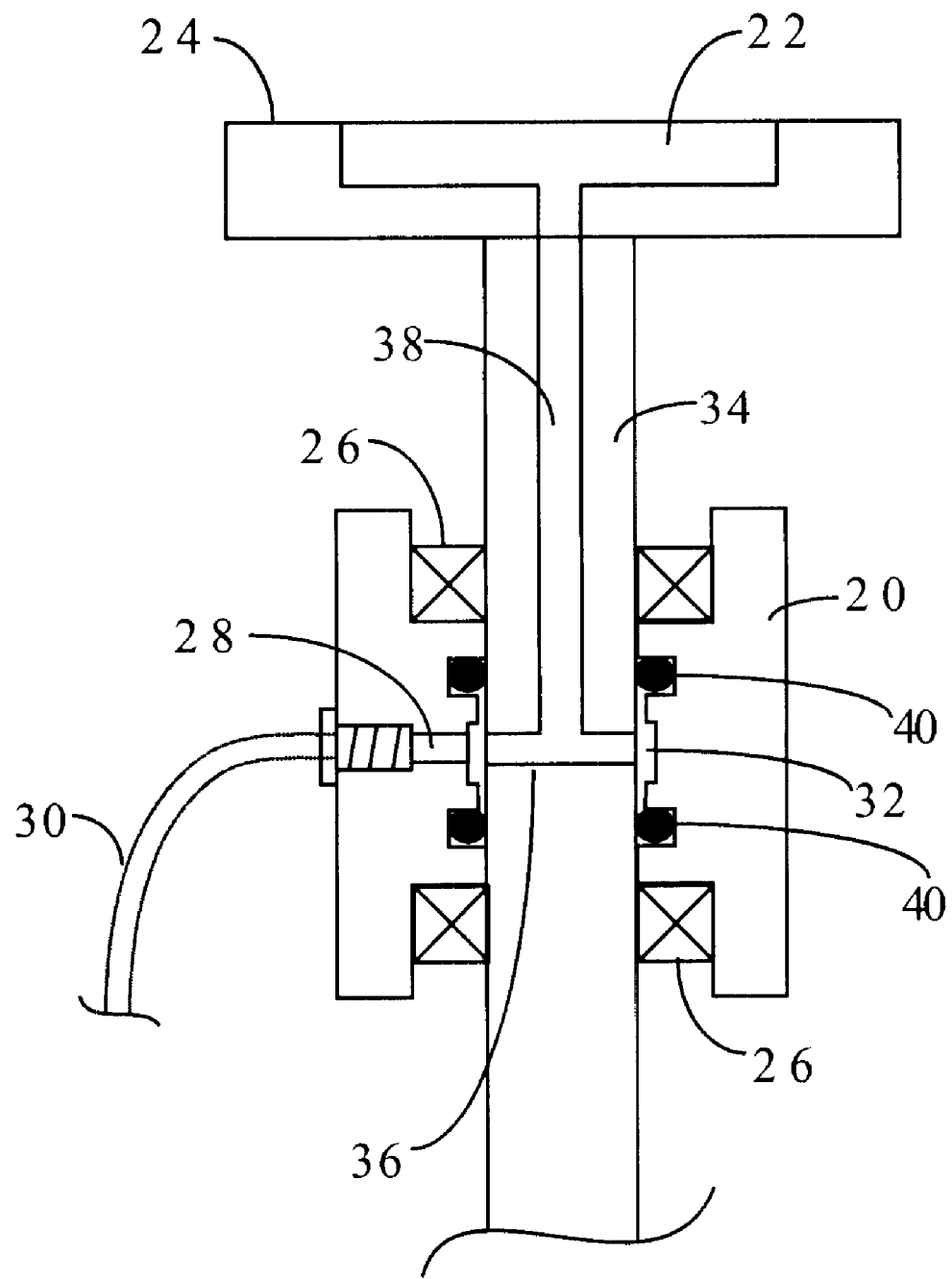
FIG. 1 is a prior art representation of a seal block in a rotational workpiece chuck to allow gas flow to and from an evacuation compartment below the workpiece surface.
Figure 2:
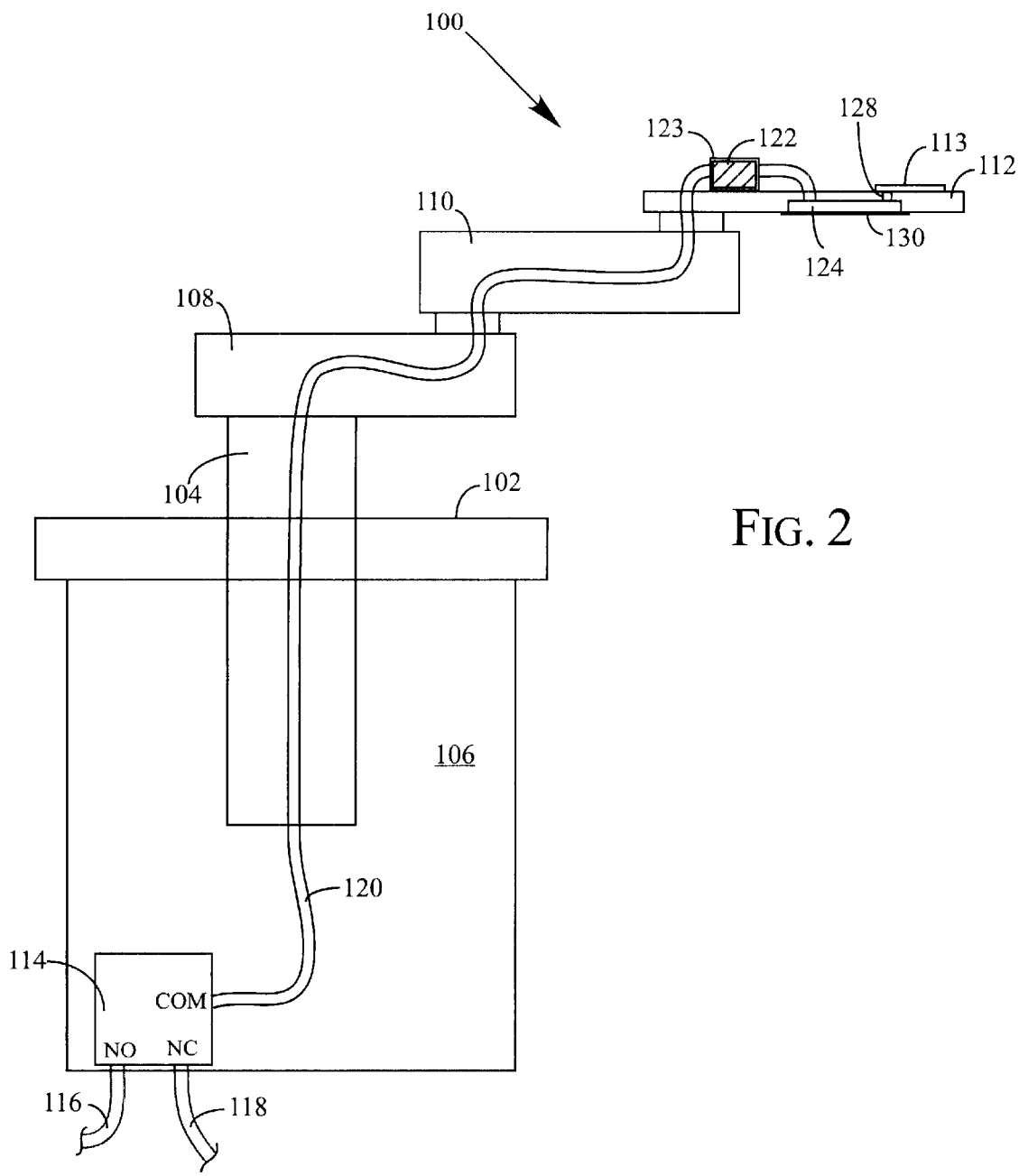
FIG. 2 is a front view of a robot including a clean vacuum holding system according to the present invention.
Figure 3:
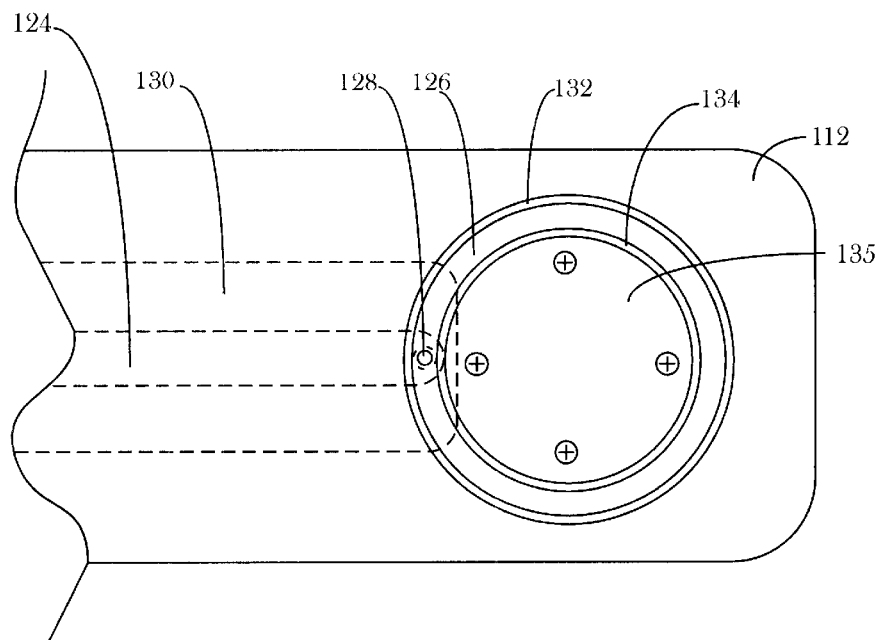
FIG. 3 is a top view of an end effector including a portion of the clean vacuum holding system according to the present invention.

Referring now to FIGS. 2 and 3, there is shown a clean vacuum holding system 100 incorporated into a wafer handling robot 102. Although not critical to the present invention, robot 102 includes a shaft 104 mounted in a base 106 for translation along a vertical axis. A first arm, or link, 108 is rotatably mounted to an upper end of the shaft 104, and a second arm, or link, 110 is rotationally mounted to the opposite end of the first arm 108. The workpiece handling robot 102 further includes an end effector 112 pivotally attached to the second arm 110 for supporting the workpiece. A support platform 113 may be attached to end effector 112 for supporting a workpiece with a vacuum grip as explained hereinafter. Various motors (not shown) are further provided, conventionally mounted in the base 106, for translating the shaft, and for rotating the first and second arms 108, 110 such that the end effector 112 may be controllably maneuvered in three-dimensional space.

The clean vacuum holding system 100 includes an electric valve 114 of known design having a normally on connection 116 to a vacuum pump (not shown) and a normally off venting connection 118 to a source of air or other gas. The electric valve 114 may vent air from the wafer fab. Alternatively, the connection 118 may be connected to a source of clean air or gas. The electric valve 114 is affixed to a flexible hose 120 which is threaded through the base 106, shaft 104, first link 108, second link 110 and terminates at end effector 112.

In accordance with the principles of the present invention, hose 120 is connected to an in-line filter 122. In one embodiment shown in FIG. 2, the hose 120 may be connected at the inlet to a filter housing 123 in which the filter 122 is situated, and the hose 120 may continue to the end effector 112 from an outlet of the filter housing 123. The filter housing 123 may open to allow periodic replacement of the filter 122.

In a preferred embodiment, filter 122 is located proximate to the support platform 113 as explained in greater detail hereinafter. Filter 122 may be of various known constructions including in-line filters, such as those manufactured by Millipore, of Bedford, Mass., fiber membrane filters, such as those manufactured by Donaldson Company, Inc of Minneapolis, Minn. and/or sintered metal particle filters, such as those manufactured by the Mott Corporation of Farmington, Conn. Filter 122 may alternatively be a high efficiency particle arresting (HEPA) filter. Other known filters are contemplated. The size of the filter 122 may be customized as needed, and the type and size of filter chosen will depend in part on the desired filtering and flow impedance capabilities desired for the system as explained hereinafter.

As is known in the art, end effector 112 has a canal 124 formed on a bottom surface thereof, which canal 124 has a first end in communication with the distal end of hose 120, and a second end in communication with an evacuation channel 126 (shown on FIG. 3) via a through hole 128 extending between the canal 124 and channel 126. Canal 124 may be sealed by a known, low outgassing adhesive tape 130, or other suitable cover.

Evacuation channel 126 is formed by a pair of raised annular walls 132 and 134. The walls 132 and 134 are preferably narrow, on the order of 10 to 40 mils, and preferably around 20 mils, and represent the highest points on support platform 113. Thus, walls 132 and 134 are the only portions of platform 113 that contact the wafer. Thus, the surface area of the platform 113 in contact with the wafer is minimized. The walls 132 and 134 are also at a diameter near the outer edges of end effector 112 to provide a relatively large surface area to the evacuation channel 126, thus providing a large force for holding the wafer on platform 113. The wall 134 defines a central recessed area 135. Although not shown in the drawings, it is contemplated that a bore hole be provided in the recessed area 135 to connect the recessed area 135 to the vacuum/vent system.

In a preferred embodiment, the walls 132 and 134 may be formed of, or have an upper surface coated with a plastic or resin, such as for example Vespel®, Ultem® or ultra-high molecular weight polyethylene (UHMWPE). It is also contemplated that the wall 132 include at least a portion formed of ceramic. It is further preferable that evacuation channel 126 be relatively shallow, for example about 10 to 40 mils, and preferably around 20 mils. This minimizes the volume of gas to be vented into or evacuated from evacuation channel 126 as explained in greater detail below. It is understood that the dimensions of walls 132 and 134, and of channel 126 may vary in alternative embodiments.

Figure 6:
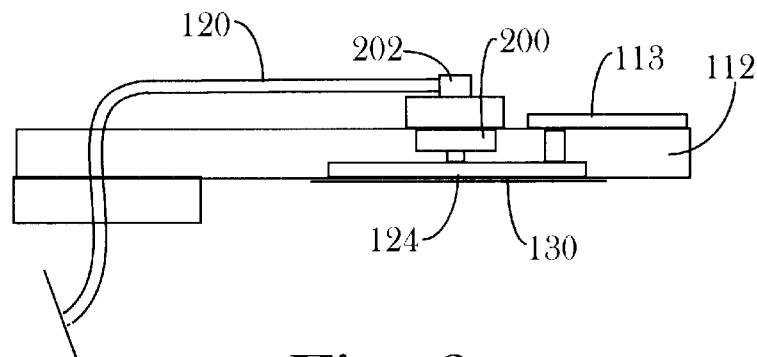
FIG. 6 is a side view of an end effector including a filter assembly according to an alternative embodiment of the invention.
Figure 7:
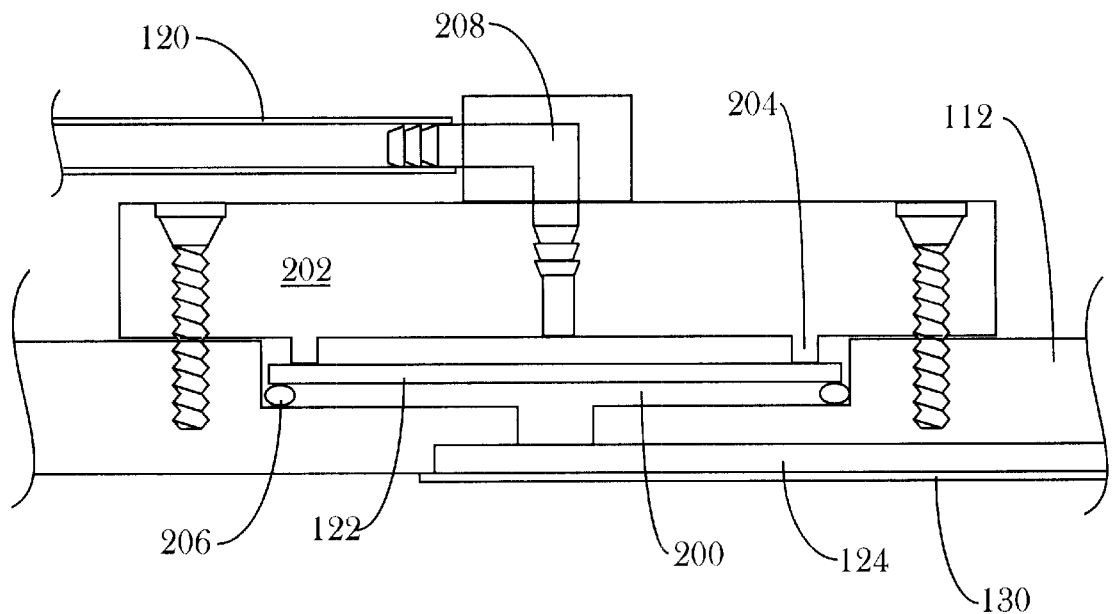
FIG. 7 is an enlarged side view of the filter assembly according to the alternative embodiment shown in FIG. 6.

In a second embodiment of a filter assembly shown in FIGS. 6 and 7, a disk filter 122 formed of either a fiber membrane or sintered metal is mounted within a cavity 200, and held therein by a cap 202 which is screwed or otherwise removably fastened onto the end effector 112. In particular, the filter 122 may be secured in position by an annular ring 204 extending down from the cap 202 and into contact with the upper surface of the filter 122. An annular O-ring 206 may be provided in the cavity 200 against which a bottom of the filter 122 rests. A sintered metal filter has sufficient rigidity so that they may sandwiched between the ring 204 and O-ring 206 on its own. However, where fiber membrane filters are used, the filter may optionally be placed in a rigid frame at its edges to lend rigidity to the filter between the ring 204 and O-ring 206. The hose 120 connects to the cap 202, which includes an opening 208, so that gas may flow between the hose 120 and canal 124 through the filter 122. The ring filter 122 may be periodically replaced by removing the cap 202.

Figure 5:
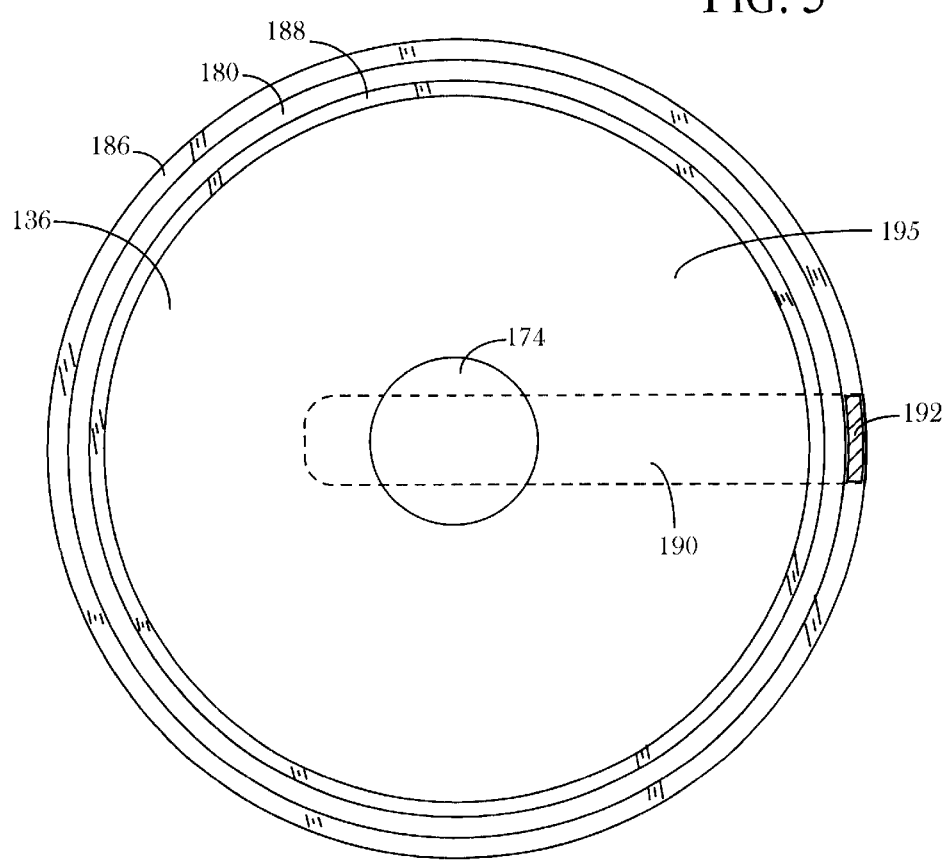
FIG. 5 is a top view of a workpiece chuck including a portion of the clean vacuum holding system according to the present invention.
Figure 4:
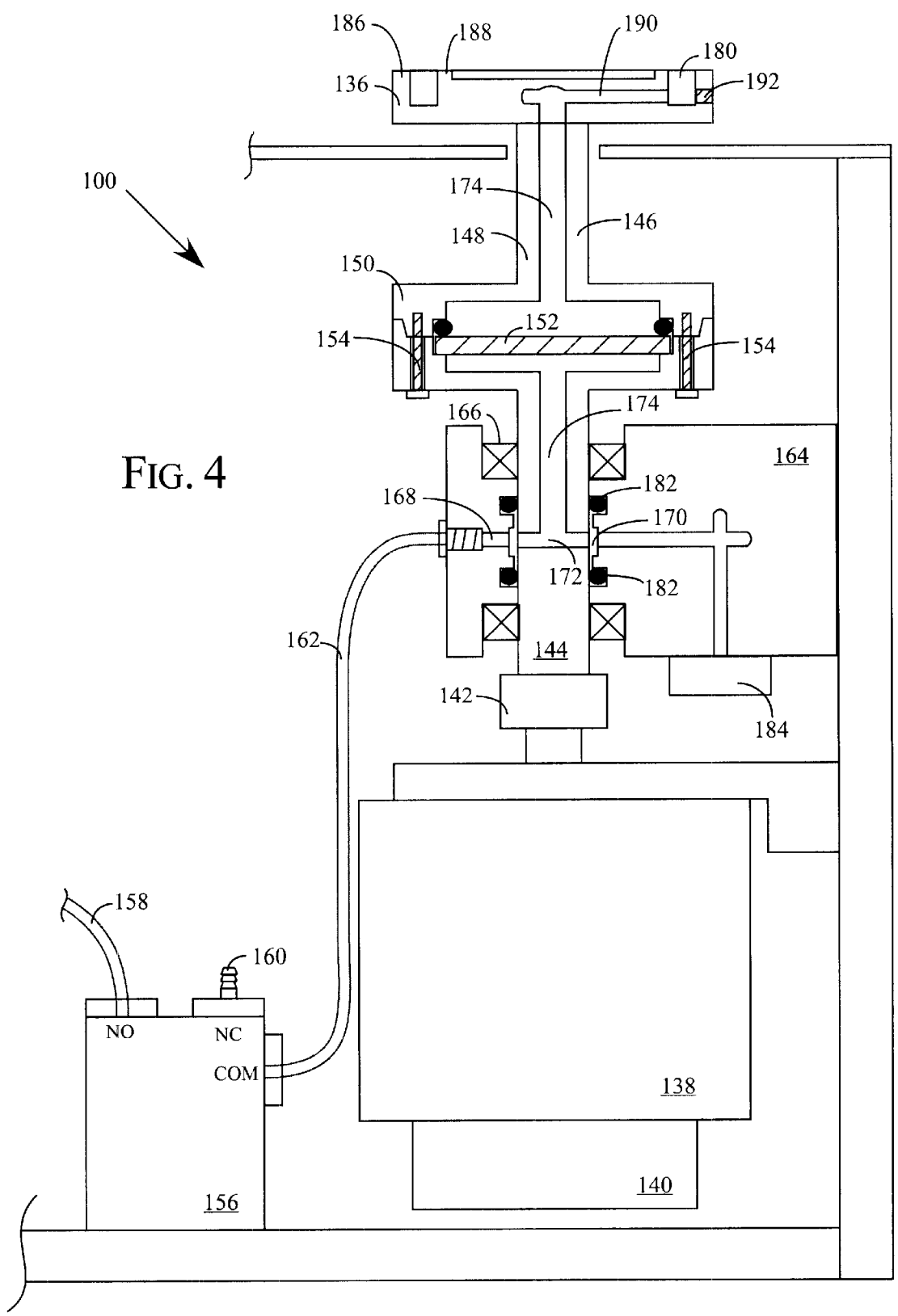
FIG. 4 is a front view of a workpiece chuck including a clean vacuum holding system according to the present invention.

The clean vacuum holding system 100 according to the present invention may also be used on a workpiece chuck 136 as shown in FIGS. 4 and 5. The workpiece chuck 136 shown is rotational, and in general includes DC motor 138 for driving rotation and an encoder 140 for angular position sensing. The armature of the motor is affixed to a flexible coupling 142, which is in turn affixed to a lower portion 144 of a shaft 146. Shaft 146 further includes an upper portion 148 to which the chuck 136 is mounted.

A filter casing 150 divides the upper and lower portions of the shaft 146. Filter casing 150 houses a filter 152, which may be of similar construction to filter 122 used in the clean vacuum holding system 100 on end effector 112. The type and dimensions of filter 152 are chosen to provide a high degree of filtering while at the same time providing a desired degree of flow impedance therethrough as will be explained hereinafter. Filter casing 150 may be easily opened upon removal of screws 154 to allow periodic replacement of filter 152.

The clean vacuum holding system 100 utilized with a workpiece chuck includes an electric valve 156 of known construction, with a normally open connection 158 to a vacuum pump (not shown) and a normally closed connection 160 to the source of venting air. The electric valve 156 may vent air from the wafer fab. Alternatively, the connection 160 may be connected to a source of clean air or gas.

A hose 162 has a first end connected to the electric valve, and a second end affixed to an inlet to a seal block 164. As described in the Background of the Invention section, seal block 164 allows air to be evacuated and vented from the rotating chuck 136. In particular, seal block 164 includes bearings 166 for rotationally supporting the chuck 136, and a bore hole 168 having a first end to which the hose 162 is connected. The bore hole 168 includes a second end open to an annular cavity 170. The lower portion 144 of shaft 146 in turn includes a second bore hole 172 which maintains a central opening 174 in the shaft in fluid communication, through filter 152, to an evacuation channel 180 in chuck 136 as described hereinafter. The seal block 164 further includes a pair of O-rings 182 above and below the annular cavity 170 to prevent leakage into or out of the annular cavity 170 as shaft 146 rotates. A vacuum sensor 184 may also be open to annular cavity 170 to sense the pressure within the evacuation/venting path. Upon evacuation, the sensor is provided to monitor for a set point pressure which, when attained, indicates the wafer is held and can be moved. The sensor can also sense when vacuum is released upon venting.

As shown in FIGS. 4 and 5, the evacuation channel 180 in chuck 136 is formed by a pair of raised annular walls 186 and 188. The walls 186 and 188 are preferably narrow, on the order of 10 to 40 mils and preferably around 20 mils, and represent the highest points on chuck 136. The upper surfaces of walls 186 and 188 are the only portions of platform 113 that contact the wafer. Thus, the surface area of the platform 113 in contact with the wafer is minimized. The walls 186 and 188 are also located at the outer diameter of chuck 136 to provide a relatively large surface area to the evacuation channel 180, thus providing a large force for holding the wafer on chuck 136. A horizontal bore 190 is provided from the outer circumference of the chuck 136, through the annular walls 186, 188 and to the central opening 174. Thus, flow from the central opening 174 is communicated to the evacuation channel 180. A plug 192 may be provided in outer wall 186 to prevent leakage of gas into or out of channel 180 through any means other than central opening 174. The wall 188 defines a central recessed area 195. Although not shown in the drawings, it is contemplated that a bore hole be provided in the recessed area 195 to connect the recessed area to the vacuum/vent system.

In a preferred embodiment, the walls 186 and 188 may be formed of, or have an upper surface coated with a plastic or resin, such as for example Vespel®, Ultem® or UHMWPE. It may also be formed at least partially of a ceramic It is further preferable that evacuation channel 180 be relatively shallow, for example about 10 to 40 mils, and preferably around 20 mils. This minimizes the volume of gas to be vented into or evacuated from evacuation channel 180 as explained in greater detail below. It is understood that the dimension of walls 186 and 188, and of channel 180 may vary in alternative embodiments.

In accordance with the present invention, the filters 122, 152 serve at least three functions. First, as discussed in the Background of the Invention section, upon blasting the venting air into the line, particles from the fab, the electric valve, the hose, and the rotating seal (in the case of a rotating chuck) can be vented onto the back side of the wafer. The filter filters out these particles so that only clean air or other vented gas comes into contact with the workpiece.

Even with the filtering, it is desirable that the back side of the wafer not be hit with a blast of air during venting. This blast can potentially dislodge particles in the area adjacent the wafer. Therefore, a second function of filters 122, 152 is to impede the flow of air to the back side of the wafer. This may be controlled by controlling the area of the filter (i.e., a filter having a long length through which the vented air must travel would have a relatively high impedance) and/or the type of filter (i.e., a dense filter material would have a relatively high impedance). In a preferred embodiment, the flow of the vented air to the back side of the wafer should not exceed 5 to 200 cu.ins./sec., and preferably not above 10 cu.ins./sec. In one embodiment of the invention, where filters 122 and 152 comprise in-line filters, the filters can have an area through which the vented gas must flow of approximately 2 sq.ins. In an embodiment of the invention, where filters 122 and 152 comprise a sintered metal or fiber membrane, the filters can have a thickness through which the vented gas must flow of approximately 2–30 mils. It is understood that these numbers are merely exemplary and may vary significantly in alternative embodiments.

As further discussed in the Background of the Invention, it is necessary that a vacuum system be fully vented before a wafer is transferred, but it is also desirable that no appreciable delays occur while accomplishing the venting. Both of these concerns are addressed in the present invention as a result of the location of the filters 122 and 152 and the configuration of the evacuation channels 126 and 180. In particular, by placing the filters near to the distal end of the vacuum path, i.e., at or near the wafer holding area, the blasted vent air may travel rapidly over the majority of the vacuum path, and have only a minimal volume to backfill behind, or downstream of, the filter. This minimal volume may be filled relatively quickly, even at the reduced flow rate, so that no delay occurs in venting the vacuum.

Moreover, by making the evacuation channels 126 and 180 relatively shallow, this further reduces the volume of air required to vent the evacuation channels. In an embodiment of the invention shown in FIG. 2, the volume of air required to vent the evacuation channel 126 may be for example 0.2 to 0.3 cu.ins. In an embodiment of the invention shown in FIGS. 6 and 7, the volume of air required to vent the evacuation channel 126 maybe for example 0.15 to 0.2 cu.ins for a 1 in. diameter disk. In an embodiment of the invention shown in FIG. 4, the volume of air required to vent the evacuation channel 180 may be for example 0.1 cu.in. for a 1 in. diameter disk.

Although the invention has been described in detail herein, it should be understood that the invention is not limited to the embodiments herein disclosed. Various changes, substitutions and modifications may be made thereto by those skilled in the art without departing from the spirit or scope of the invention as described and defined by the appended claims.

A method for preventing contaminants and particulates from coming into contact with a back side of a workpiece as the workpiece is vacuum held on a chuck or robotic end effector. The method, in part, includes venting a fluid into a vacuum path and filtering any particles that are dislodged within the vacuum path upstream of the end effector that is supporting the wafer.

I claim:

1. A method for preventing particles and contaminants from contacting a back side of a workpiece, the method comprising the steps of:
    (a) venting a fluid into an evacuated vacuum path and creating a flow of fluid traveling from a vent port to a distal end of the vacuum path, the vacuum path being in fluid communication with a channel located beneath the back side of the workpiece while the workpiece is seated on a support surface;
    (b) filtering the fluid upstream of the channel to remove the particles and contaminants with a filter that is located along the vacuum path; and
    (c) impeding the flow of fluid within the vacuum path such that the flow rate of the fluid upstream of the filter is greater than the flow rate of the fluid downstream of the filter.

2. The method as recited in claim 1, wherein the filter in step (b) is located proximate to the distal end of the vacuum path.

3. The method as recited in claim 1, wherein the support surface is defined by a pair of spaced apart raised annular walls.

4. The method as recited in claim 3, wherein an evacuation channel is defined by the space located between the annular walls.

5. A method for preventing contaminants and particles from contacting a back side of a workpiece as the workpiece is vacuum held on an end effector of a workpiece handling robot, the workpiece handling robot having a vacuum path that provides fluid communication between a vent port and an evacuation channel within the end effector, the method comprising the steps of:
    (a) venting a fluid into an evacuated vacuum path and creating a flow of fluid traveling from the vent port to the evacuation channel;
    (b) filtering the fluid with an in-line filter located upstream of the evacuation channel to remove the particles and contaminants within the vacuum path; and (c) impeding the flow of fluid within the vacuum path such that the flow rate of the fluid upstream of the filter is greater than the flow rate of the fluid downstream of the filter.

6. The method as recited in claim 5, wherein the filter in said step (b) is located proximate to the evacuation channel.

7. A method for preventing contaminants and particles from contacting a back side of a workpiece as the workpiece is vacuum held on a chuck of a tool, the tool having a vacuum path between a vent port and an evacuation channel formed in the chuck, the method comprising the steps of:

(a) venting a fluid into an evacuated vacuum path and creating a flow of fluid that travels substantially from the vent port to the evacuation channel;

(b) filtering the fluid with a filter located upstream of the evacuation channel; and (c) impeding the flow of fluid such that the speed of the flow upstream of the filter is greater than the speed of the flow downstream of the filter.

8. The method as recited in claim 7, wherein the filter in said step (b) is in-line with the vacuum path.

9. The method as recited in claim 8, wherein the filter in said step (b) is located proximate to the evacuation channel.

10. The method as recited in claim 7, wherein the filter in said step (b) is located at a point remote from the vacuum path.

* * * * *